United States Patent
Cho et al.

(10) Patent No.: US 7,470,588 B2
(45) Date of Patent: Dec. 30, 2008

(54) TRANSISTORS INCLUDING LATERALLY EXTENDED ACTIVE REGIONS AND METHODS OF FABRICATING THE SAME

(75) Inventors: Min-Hee Cho, Gyeonggi-do (KR); Ji-Young Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 26 days.

(21) Appl. No.: 11/387,029

(22) Filed: Mar. 22, 2006

(65) Prior Publication Data

US 2007/0063270 A1    Mar. 22, 2007

(30) Foreign Application Priority Data

Sep. 22, 2005    (KR) .................... 10-2005-0088333

(51) Int. Cl.
*H01L 21/336* (2006.01)
(52) U.S. Cl. ............... 438/272; 257/330; 257/E21.428
(58) Field of Classification Search ................ 438/272; 257/330, E21.428
See application file for complete search history.

(56) References Cited

U.S. PATENT DOCUMENTS

| | | | | |
|---|---|---|---|---|
| 5,895,253 | A * | 4/1999 | Akram | ........................ 438/424 |
| 6,476,444 | B1 * | 11/2002 | Min | ........................ 257/330 |
| 6,844,591 | B1 | 1/2005 | Tran | ........................ 257/330 |
| 7,141,486 | B1 | 11/2006 | Rossi et al. | |
| 2001/0023960 | A1 * | 9/2001 | Soga et al. | ........................ 257/330 |
| 2001/0036705 | A1 * | 11/2001 | Nishida et al. | ........................ 438/296 |
| 2003/0085435 | A1 | 5/2003 | Wang | ........................ 257/396 |
| 2006/0049455 | A1 * | 3/2006 | Jang et al. | ........................ 257/330 |
| 2006/0113590 | A1 * | 6/2006 | Kim et al. | ........................ 257/330 |

FOREIGN PATENT DOCUMENTS

| | | |
|---|---|---|
| JP | 2002-353445 | 12/2002 |
| KR | 1020000060693 A | 10/2000 |
| KR | 1020010081253 A | 8/2001 |
| KR | 1020060077543 A | 7/2006 |
| KR | 1020060099179 A | 9/2006 |
| KR | 1020060102878 A | 9/2006 |

OTHER PUBLICATIONS

Korean Office Action dated Jul. 10, 2008; p. 1.

* cited by examiner

*Primary Examiner*—Douglas M Menz
*Assistant Examiner*—Steven J. Fulk
(74) *Attorney, Agent, or Firm*—Myers Bigel Sibley & Sajovec, PA

(57) ABSTRACT

A transistor includes a substrate and an isolation region disposed in the substrate. The isolation regions defines an active region comprising upper and lower active regions, the upper active region having a first width and the lower active region having a second width greater than the first width. An insulated gate electrode extends through the upper active region and into the lower active region. Source and drain regions are disposed in the active region on respective first and second sides of the insulated gate electrode. The insulated gate electrode may include an upper gate electrode disposed in the upper active region and a lower gate electrode disposed in the lower active region, wherein the lower gate electrode is wider than the upper gate electrode. Related fabrication methods are described.

22 Claims, 9 Drawing Sheets

FIG. 1
(PRIOR ART)
FIG. 2
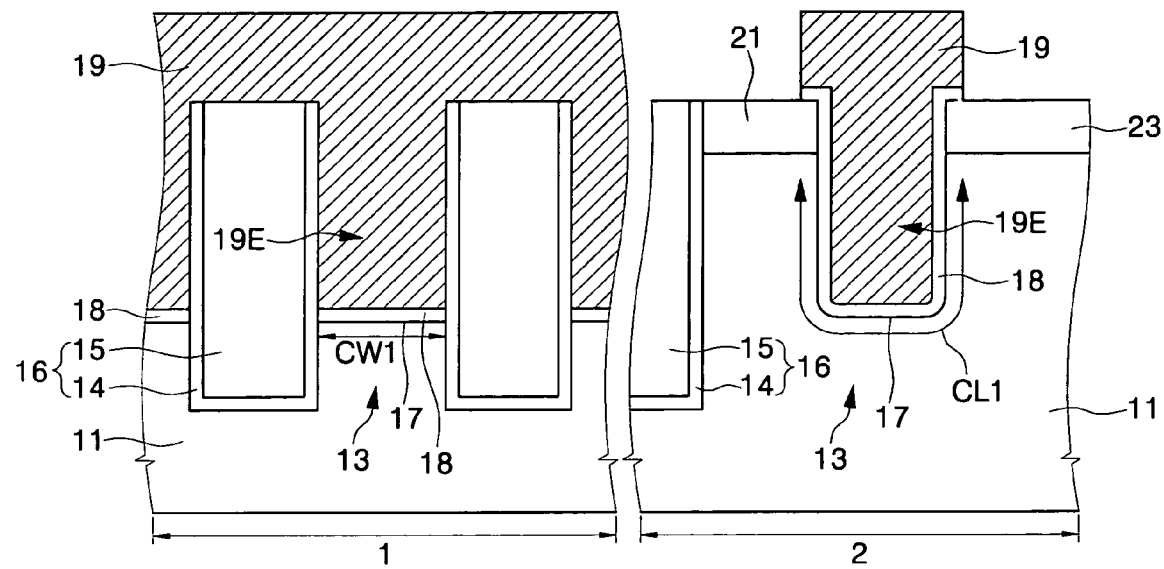
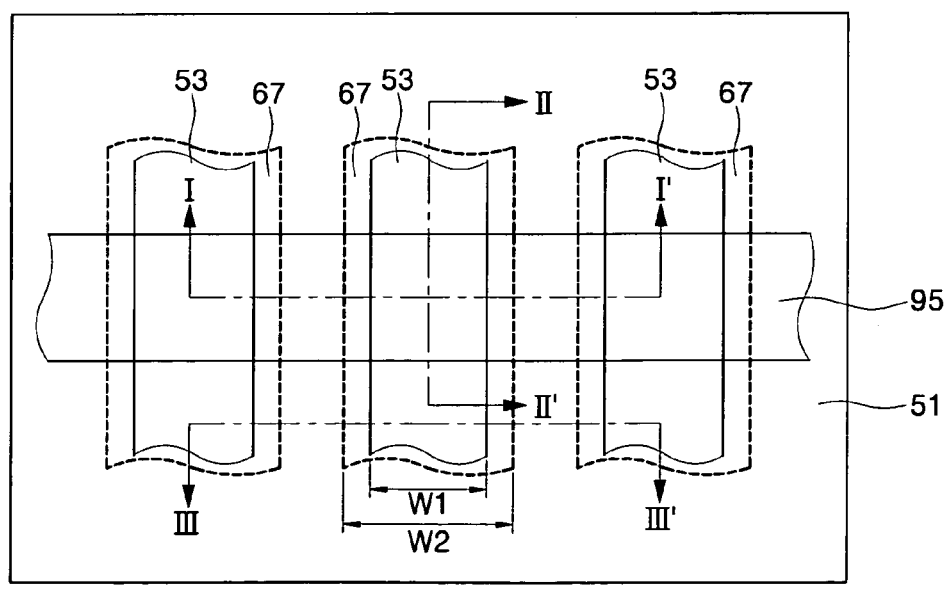

TRANSISTORS INCLUDING LATERALLY EXTENDED ACTIVE REGIONS AND METHODS OF FABRICATING THE SAME

CROSS-REFERENCE TO RELATED APPLICATION

This application claims the benefit of Korean Patent Application No. 2005-0088333, filed Sep. 22, 2005, the contents of which are hereby incorporated herein by reference in their entirety.

BACKGROUND OF THE INVENTION

The present invention relates to semiconductor devices and methods of fabricating the same, and more particularly, to semiconductor devices having recessed gate electrodes and methods of fabricating the same.

As electronic products employing semiconductor devices have become increasingly thin, lightweight, and compact, semiconductor devices used in such produce generally have been required to become more highly integrated. Accordingly, research for reducing the two-dimensional size of transistors has been ongoing.

Reduction in transistor size may lead to a reduction in channel length and channel width. Drive current of a transistor is generally inversely proportional to the channel length, and generally is proportional to the channel width. A reduction in channel length may increase the drive current and response speed. In contrast, the reduction in channel length may cause problems, such as punch-through. Consequently, there is a continuing need for technology for minimizing the two-dimensional size of transistors while providing an effective channel length.

A configuration known as a recess channel array transistor (RCAT) has been proposed to increase effective channel length. A gate trench is formed within an active region of the RCAT. An insulated gate electrode fills the gate trench and crosses the active region. The gate trench may act to increase the effective channel length.

Another configuration referred to as a spherical recess channel array transistor (SRCAT) has been proposed to increase effective channel length. An upper gate trench is formed within an active region of the SRCAT. A lower gate trench is formed in the shape of a flask below the upper gate trench. An insulated gate electrode fills the upper and lower gate trenches and crosses the active region. The upper and lower gate trenches may increase the effective channel length.

A reduction in channel width typically decreases the drive current. Generally, channel width is designed in consideration of the drive current required for the operation of the semiconductor device. Accordingly, techniques that extend effective channel width may be advantageous in terms of the reduction in transistor channel width.

FIG. 1 is a cross-sectional view of a conventional RCAT. A first region 1 of FIG. 1 is a cross-section of the RCAT in a word line direction, and a second region 2 of FIG. 1 is a cross-section of the RCAT in a bit line direction. Referring to FIG. 1, the conventional RCAT has an isolation layer 16 defining an active region 13 within a semiconductor substrate 11. The isolation layer 16 may include a sidewall oxide layer 14 and an insulating layer 15, which are stacked. A gate trench 17 is formed in the active region 13. The gate trench 17 crosses the active region 13 and partially exposes sidewalls of the isolation layer 16. A gate electrode 19 is formed across the active region 13. The gate electrode 19 has a gate electrode 19E extending into the gate trench 17. A gate dielectric layer 18 is interposed between the active region 13 and the gate electrode 19. The gate dielectric layer 18 is also interposed between the active region 13 and the gate electrode 19E. Source and drain regions 21 and 23 are formed within the active region 13 at respective sides of the gate electrode 19.

An effective channel length CL1 of the RCAT is relatively long compared to a planar transistor because of the gate trench 17. Accordingly, even when the two-dimensional size of the RCAT is reduced, a desirable effective channel length CL1 may be secured.

However, an effective channel width CW1 of the RCAT may be dependent on the size of the active region 13. The active region 13 is defined by the isolation layer 16. In the illustrated device, to reduce the two-dimensional size of the RCAT, it may be advantageous to reduce the active region 13 to a resolution limit of a photolithography process. The reduction in active region 13 may cause the effective channel width CW1 to be reduced. In this case, current drivability of the RCAT may be reduced.

The width of the active region 13 may be increased to increase the effective channel width CW1. However, this approach may work against high integration of the RCAT.

Another technique for increasing effective channel width is described in U.S. Patent Publication No. 2003/0085435 to Wang entitled "Transistor Structure and Process to Fabricate Same." According to this published application, at least one recess region is formed in a channel length direction of an active region. An insulated gate electrode is formed across the recess regions. The recess regions act to extend the effective channel width of the transistor. Another technique for forming a transistor is described in U.S. Pat. No. 6,844,591 to Tran entitled "Method of Forming DRAM Access Transistors."

There is an ongoing need for techniques for reducing transistor size while providing desirable effective channel width.

SUMMARY OF THE INVENTION

In some embodiments of the present invention, a transistor includes a substrate and an isolation region disposed in the substrate. The isolation region defines an active region comprising upper and lower active regions, the upper active region having a first width and the lower active region having a second width greater than the first width. An insulated gate electrode extends through the upper active region and into the lower active region. Source and drain regions are disposed in the active region on respective first and second sides of the insulated gate electrode. The insulated gate electrode may include an upper gate electrode disposed in the upper active region and a lower gate electrode disposed in the lower active region, wherein the lower gate electrode is wider than the upper gate electrode. The insulated gate electrode may have a flask-shaped cross-section.

In some embodiments, the isolation region comprises an upper isolation region bounding the upper active region and a lower isolation region bounding the lower active region and having a lesser width than the upper isolation region. The upper gate electrode may contact the upper isolation region, and the lower gate electrode may contact the upper isolation region. The source and drain regions may extend into the lower active region.

Further embodiments of the present invention provide methods of fabricating transistors. An isolation region is formed in a substrate to define an active region that comprises an upper active region having a first width and a lower active region having a second width greater than the first width. An insulated gate electrode is formed that passes through the upper active region and extends into the lower active region.

Source and drain regions are formed in the active region on respective sides of the insulated gate electrode.

Formation of the isolation region may include forming a mask pattern on the substrate, etching the substrate using the mask pattern as an etch mask to form a first trench, forming a narrower second trench in the substrate at a bottom of the first trench, and forming an insulation region in the first and second trenches. Formation of the narrower second trench may include forming a spacer on a sidewall of substrate in the first trench and etching the substrate using the mask pattern and the spacer as an etch mask to form the second trench. The spacer may include a silicon oxide layer, a silicon nitride layer and/or a silicon oxynitride layer. Formation of the spacer may include forming a first oxide layer on a sidewall of the substrate of the first trench, forming a nitride liner on the first oxide layer, forming a second oxide layer on the nitride liner and etching the first oxide layer, the nitride liner, and the second oxide layer to expose a bottom surface of the first trench. The first oxide layer may be a thermal oxide layer, the nitride liner may be a silicon nitride layer and/or a silicon oxynitride layer, and the second oxide layer may be a silicon oxide layer formed by chemical vapor deposition. The second trench may be formed to a width less than a resolution limit of a photolithography process used to form the first trench. A thermal oxide layer may be formed on a sidewall of the substrate in the second trench before filling the first and second trenches with an insulating material.

Formation of the insulated gate electrode may include forming a gate trench in the active region, the gate trench having a first width above a first depth and a second width greater than the first width below the first depth. A gate dielectric layer conforming to a wall of the active region is formed in the gate trench. A conductive region is formed in the gate trench. Formation of the gate trench may include forming a gate mask pattern on the substrate and etching the active region using the gate mask pattern as an etch mask to form the gate trench to the first depth. Formation of the gate trench may further include forming a spacer on a sidewall of active region in the gate trench, the spacer exposing a portion of the active region at a bottom surface of the gate trench. The exposed portion of the active region at the bottom of the gate trench may be etched to deepen and widen the gate trench below the first depth. The spacer may include a silicon oxide layer formed by chemical vapor deposition.

Some embodiments of the present invention may provide a semiconductor device capable of reducing planar size while relatively extending effective channel width.

Further embodiments of the present invention provide methods of fabricating a semiconductor device capable of relatively extending its effective channel width.

In some embodiments, a semiconductor device has a laterally extended active region. The semiconductor device includes a substrate, and an upper active region disposed in the substrate and having a first width. A lower active region is connected to and disposed below the upper active region, and has a second width greater than the first width. An isolation layer is formed in the substrate to define the upper and lower active regions. An insulated gate electrode is formed across the upper and lower active regions. The insulated gate electrode penetrates the upper active region to extend into the lower active region.

In some embodiments of the present invention, the insulated gate electrode may have an upper gate electrode and a lower gate electrode. The upper gate electrode may cross the upper active region and may be formed in the upper active region. The lower gate electrode may cross the lower active region and may extend below the upper gate electrode. In this case, the lower gate electrode may have substantially the same width as the second width. In addition, the upper and lower gate electrodes may have a flask shape when seen in a cross-sectional view.

In some embodiments, the isolation layer may have an upper isolation layer and a lower isolation layer. The upper isolation layer may define the upper active region. The lower isolation layer may extend below the upper isolation layer and define the lower active region. The lower isolation layer may have a narrower width than the upper isolation layer. In addition, the lower isolation layer may have a narrower width than a resolution limit of a photolithography process.

In still other embodiments, sidewalls facing each other of the upper gate electrode may be in contact with the upper isolation layer. Sidewalls facing each other of the lower gate electrode may be in contact with the lower isolation layer.

In yet other embodiments, source and drain regions may be formed in the substrate at both sides of the insulated gate electrode. Bottom surfaces of the source and drain regions may be lower than the upper active region.

In additional embodiments, methods of fabricating a semiconductor device include forming an isolation layer to define an upper active region and a lower active region. The lower active region is defined below the upper active region. The upper active region has a first width, and the lower active region has a second width greater than the first width. An insulated gate electrode is formed across the upper and lower active regions. The insulated gate electrode penetrates the upper active region to extend into the lower active region.

In some embodiments of the present invention, a hard mask pattern may be formed on the substrate. The substrate may be selectively etched using the hard mask pattern as an etch mask to form an upper isolation trench defining the upper active region. A lower isolation trench may be formed which extends below the upper isolation trench and defines the lower active region. The lower isolation trench may have a narrower width than the upper isolation trench. A lower sidewall oxide layer may be formed on an inner wall of the lower isolation trench. The lower sidewall oxide layer may be formed of a thermal oxide layer. The upper and lower isolation trenches may be filled with an insulating layer to form the isolation layer.

In some embodiments, a spacer may be formed on sidewalls of the upper isolation trench. The substrate may be anisotropically etched using the hard mask pattern and the spacer as etch masks to form the lower isolation trench. The spacer may be formed of a silicon oxide layer, a silicon nitride layer, a silicon oxynitride layer, or a combination layer thereof.

In still further embodiments, an upper sidewall oxide layer may be formed on an inner wall of the upper isolation trench. A nitride liner may be formed on the substrate having the upper sidewall oxide layer. A spacer oxide layer may be formed on the substrate having the nitride liner. The spacer oxide layer, the nitride liner, and the upper sidewall oxide layer may be anisotropically etched until the bottom surface of the upper isolation trench is exposed so that the spacer may be formed. The upper sidewall oxide layer may be formed of a thermal oxide layer, the nitride liner may be formed of a silicon nitride layer or a silicon oxynitride layer, and the spacer oxide layer may be formed of a silicon oxide layer by a chemical vapor deposition (CVD) method.

In additional embodiments, the lower isolation trench may have a narrower width than a resolution limit of a photolithography process.

In still further embodiments, an upper gate trench crossing the upper active region may be formed. A lower gate trench having a larger width than the upper gate trench may be formed below the upper gate trench. A gate dielectric layer may be formed on an inner wall of the lower gate trench, a sidewall of the upper gate trench, and a surface of the upper active region. A gate conductive layer may be formed which fills the upper and lower gate trenches and covers the substrate. The gate conductive layer may be patterned to form the insulated gate electrode. The upper and lower gate trenches may have a flask shape when seen in a cross-sectional view. The lower gate trench may have substantially the same width as the second width. In this case, the lower isolation layer may be exposed on the sidewalls facing each other of the lower gate trench.

In some embodiments, a gate mask pattern may be formed on the substrate having the isolation layer. The upper active region may be partially etched using the gate mask pattern as an etch mask to form the upper gate trench.

In some embodiments, a sacrificial spacer may be formed on a sidewall of the upper gate trench. In this case, the substrate may be exposed on a bottom surface of the upper gate trench. The substrate exposed on the bottom surface of the upper gate trench may be isotropically etched to form the lower gate trench. The isotropic etching may be carried out until the bottom surface of the lower gate trench is lower than the upper active region. The sacrificial spacer may be formed of a silicon oxide layer by a CVD method.

In additional embodiments, impurity ions may be implanted into the substrate at both sides of the insulated gate electrode to form source and drain regions. Bottom surfaces of the source and drain regions may be lower than the upper active region.

BRIEF DESCRIPTION OF THE DRAWINGS

FIG. 1 is a cross-sectional view of a conventional RCAT.

FIG. 2 is a layout of a transistor in accordance with some embodiments of the present invention.

DETAILED DESCRIPTION OF EMBODIMENTS

Figure 3:
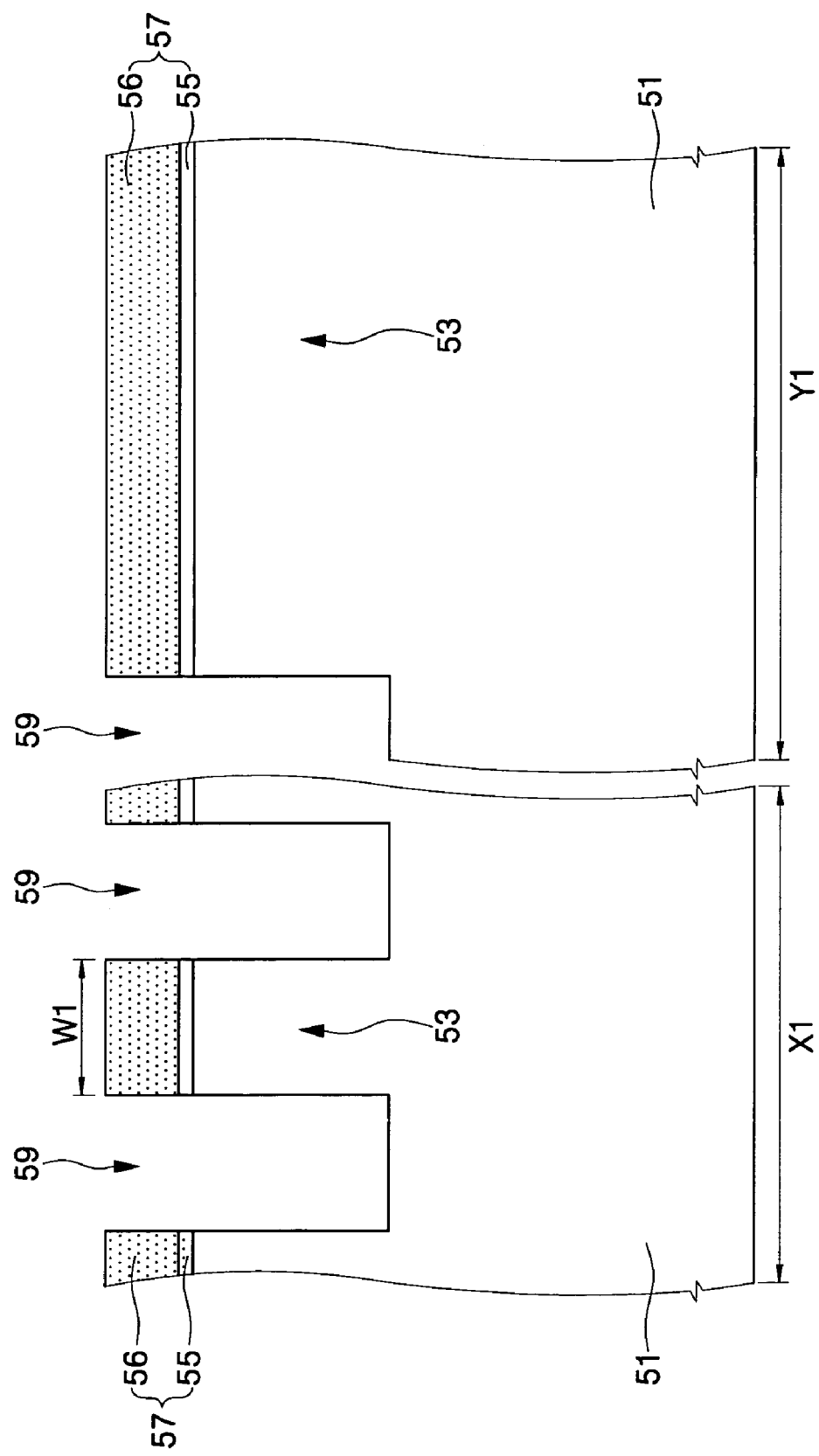
FIGS. 3 to 9 are cross-sectional views taken along lines I-I' and II-II' of FIG. 2 illustrating operations for fabricating a transistor in accordance with some embodiments of the present invention.

The present invention will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the Figures. For example, if the device in the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature, although other materials may be used.

Figure 8:
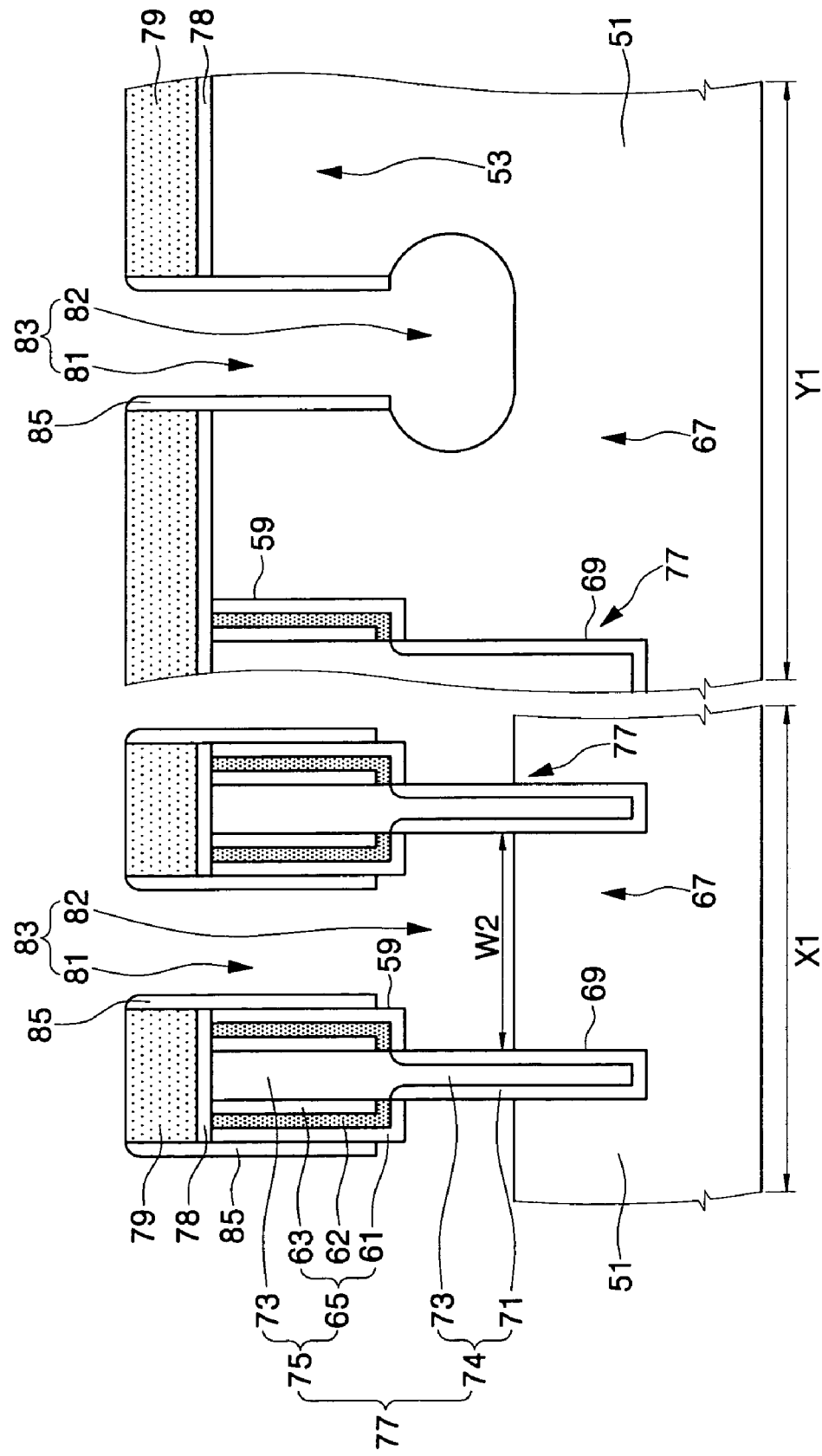
Figure 9:
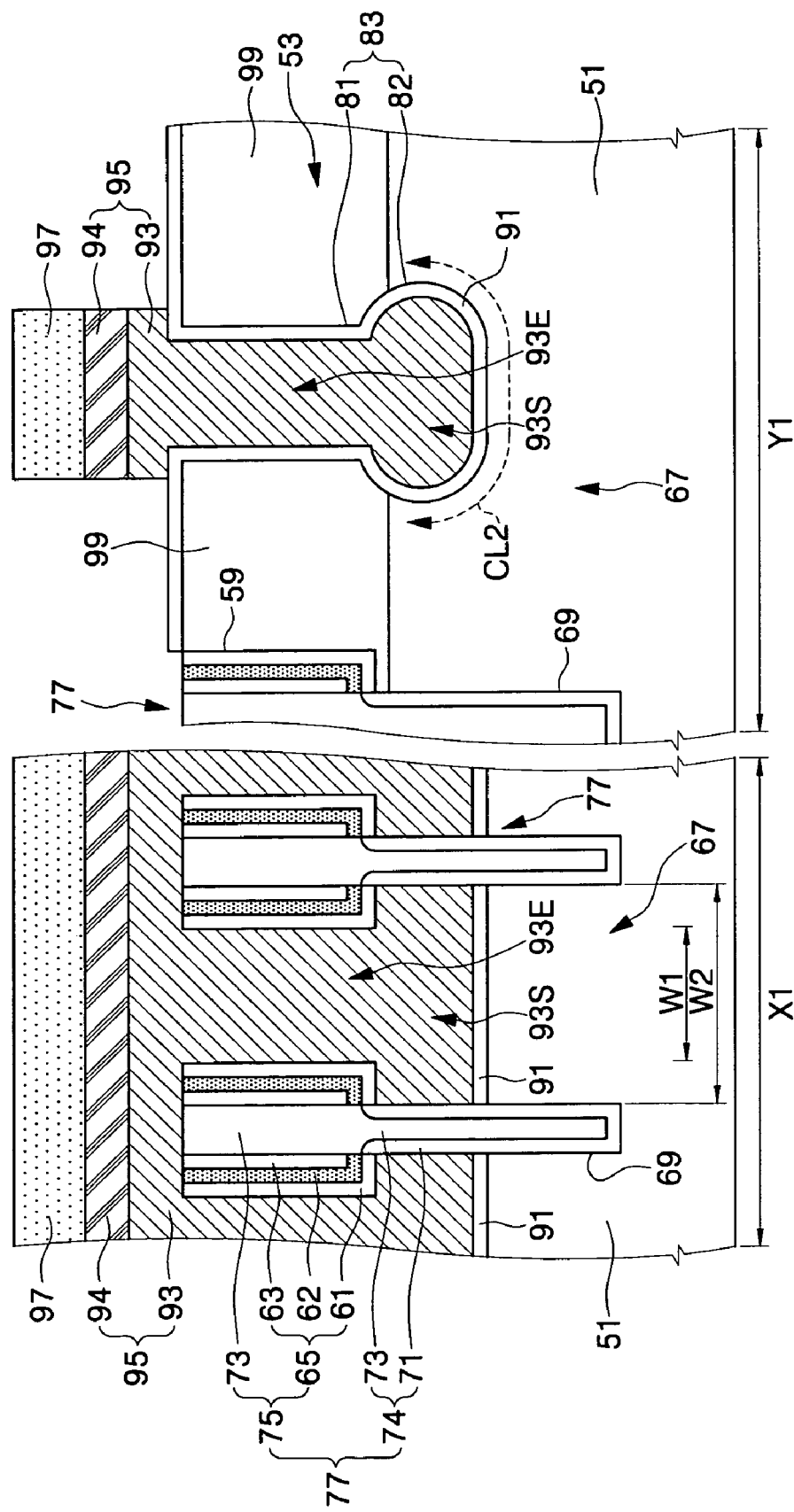
Figure 10:
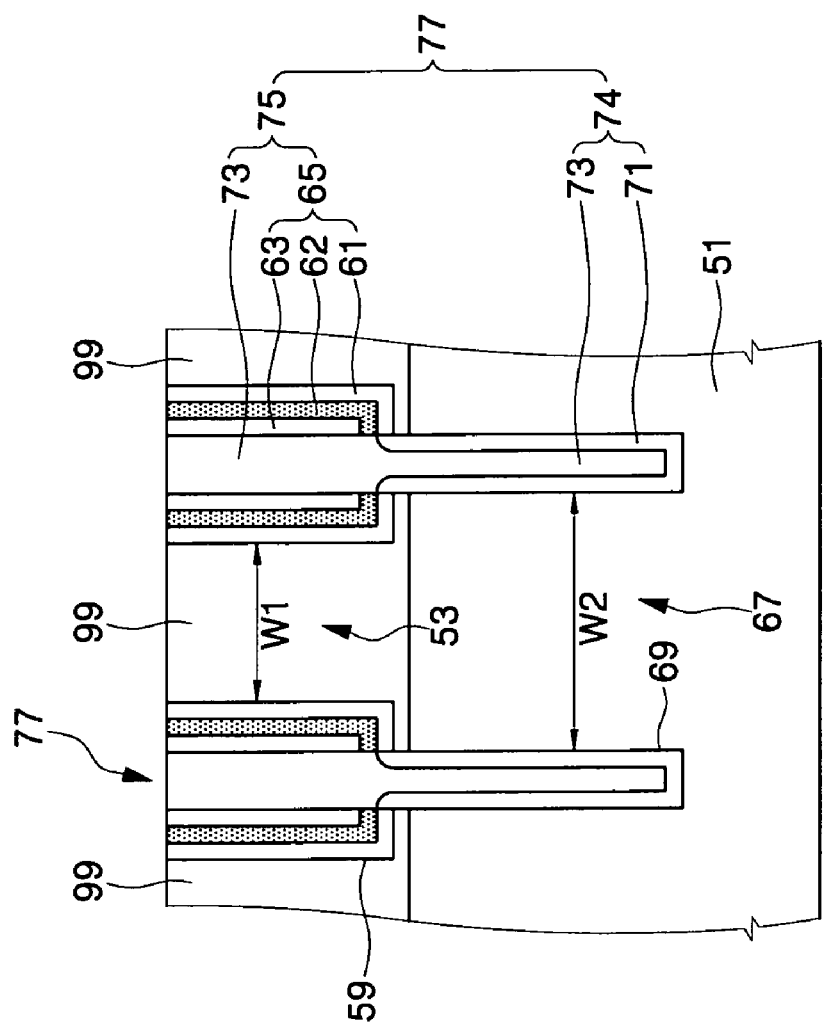
FIG. 10 is a cross-sectional view taken along line III-III' of FIG. 2 illustrating operations for fabricating a transistor in accordance with some embodiments of the present invention.

FIG. 2 illustrates a layout of a transistor in accordance with some embodiments of the present invention, and FIGS. 3 to 10 are cross-sectional views illustrating operations for forming the transistor of FIG. 2 in accordance with some embodiments of the present invention. Specifically, first regions X1 of FIGS. 3 to 9 are cross-sectional views taken along line I-I' of FIG. 2, and second regions Y1 of FIGS. 3 to 9 are cross-sectional views taken along line II-II' of FIG. 2. The line I-I' of FIG. 2 may be a word line direction of the transistor, and the line II-II' of FIG. 2 may be a bit line direction of the transistor. FIG. 10 is a cross-sectional view taken along line III-III' of FIG. 2.

A transistor according to some embodiments of the present invention will now be described with reference to FIGS. 2, 9, and 10. A transistor according to some embodiments of the present invention includes a substrate 51, and an upper active region 53 formed within the substrate 51 and having a first width W1. A lower active region 67 is disposed under the upper active region 53. The lower active region 67 has a second width W2 greater than the first width W1. An isolation region 77 is formed within the substrate 51 to define the upper and lower active regions 53 and 67. A gate trench 83 is formed across the upper and lower active regions 53 and 67. The gate trench 83 penetrates through the upper active region 53 to extend into the lower active region 67. A gate electrode 93 is formed in the gate trench 83 and crosses the upper and lower active regions 53 and 67.

The substrate 51 may be a semiconductor substrate such as a silicon wafer. The isolation region 77 may include an upper isolation region 75 and a lower isolation region 74. The lower isolation region 74 may extend from a lower portion of the upper isolation region 75. In this case, the lower isolation region 74 may be narrower than the upper isolation region 75. In addition, the lower isolation region 74 may be narrower than a resolution limit of a photolithography process, as described in detail below. The upper isolation region 75 may define the upper active region 53, and the lower isolation region 74 may define the lower active region 67. It will be understood that the upper active region 53 and the lower active region 67 may have a may have a unitary structure, e.g., may form a continuous material region, while in other embodiments, these regions may have a non-unitary structure. Similarly, the upper isolation region 75 and the lower isolation region 74 may be unitary or non-unitary.

The upper isolation region 75 may include an insulating layer 73 and a spacer 65 covering sidewalls of the insulating layer 73. The spacer 65 may be, for example, a silicon oxide layer, a silicon nitride layer, a silicon oxynitride layer, or a combination layer thereof. For example, the spacer 65 may be composed of an upper sidewall oxide layer 61, a nitride liner 62, and a spacer oxide layer 63, which are sequentially stacked. In this case, the upper sidewall oxide layer 61 may be a thermal oxide layer, the nitride liner 62 may be a silicon nitride layer or a silicon oxynitride layer, and the spacer oxide layer 63 may be a silicon oxide layer. In addition, the upper sidewall oxide layer 61 may be in contact with the upper active region 53, the spacer oxide layer 63 may be in contact with the insulating layer 73, and the nitride liner 62 may be interposed between the upper sidewall oxide layer 61 and the spacer oxide layer 63.

The lower isolation region 74 may include the insulating layer 73 and a lower sidewall oxide layer 71 covering the insulating layer 73. That is, the insulating layer 73 may extend up to the lower isolation region 74 from the upper isolation region 75. The insulating layer 73 may be, for example, a high-density plasma (HDP) oxide layer, a spin on glass (SOG) layer, or a combination thereof. The lower sidewall oxide layer 71 may be a thermal oxide layer.

The upper active region 53 is defined to have the first width W1 by the upper isolation region 75. The lower active region 67 is defined to have the second width W2 by the lower isolation region 74. The size and the first width W1 of the upper isolation region 75 may be determined by a resolution limit of a photolithography process. The lower isolation region 74 may be narrower than the upper isolation region 75. In this case, the second width W2 may be greater than the first width W1. That is, the lower active region 67 may have a width greater than that of the upper active region 53.

The gate trench 83 may include an upper gate trench 81 and a lower gate trench 82. The lower gate trench 82 may be wider than the upper gate trench 81. In detail, the upper gate trench 81 may be formed within the upper active region 53. In addition, the upper gate trench 81 may be disposed across the upper active region 53 in the first width (W1) direction. In this case, the upper gate trench 81 may have a width equal to or greater than the first width W1. The lower gate trench 82 may extend from the bottom of the upper gate trench 81. The lower gate trench 82 may be disposed across the lower active region 67 in the second width (W2) direction. In this case, the lower gate trench 82 may have a width equal to or greater than the second width W2. A bottom surface of the lower gate trench 82 may be disposed within the lower active region 67 and may expose the lower active region 67. In addition, the lower gate trench 82 may partially expose the sidewall of the lower isolation region 74. The upper gate trench 81 and the lower gate trench 82 may have a flask-shaped cross-section.

A metal silicide pattern 94 may be formed on the gate electrode 93. The gate electrode 93 and the metal silicide pattern 94 form a gate pattern 95. The gate electrode 93 may include an upper gate electrode 93E filling the upper gate trench 81, and a lower gate electrode 93S filling the lower gate trench 82. The upper gate electrode 93E extends from the bottom of the gate electrode 93, and the lower gate electrode 93S extends from the bottom of the upper gate electrode 93E. It will be understood that, in some embodiments, the upper gate electrode 93E and the lower gate electrode 93S may have a unitary structure, e.g., may form a continuous material region, while in other embodiments, these regions may have a non-unitary structure.

The upper gate electrode 93E may have a width equal to or greater than the first width W1, and the lower gate electrode 93S may have a width equal to or greater than the second width W2. The lower gate electrode 93S may be partially in contact with the sidewall of the lower isolation region 74. The upper gate electrode 93E and the lower gate electrode 93S may have a flask shape when seen in a cross-sectional view.

The gate electrode 93, the upper gate electrode 93E, and the lower gate electrode 93S may be, for example, polysilicon layers. The metal silicide pattern 94 may be a metal silicide layer, such as a tungsten silicide layer. In addition, a capping pattern 97 may be formed on the gate pattern 95. The capping pattern 97 may be, for example, a silicon nitride layer.

A gate dielectric layer 91 is interposed between the gate electrode 93 and the substrate 51. The gate dielectric layer 91 may conform to an inner wall of the gate trench 83. The gate dielectric layer 91 may include, for example, a silicon oxide layer or a high-k dielectric layer.

Source and drain regions 99 may be formed in the substrate 51 at respective sides of the gate electrode 93. The source and drain regions 99 may be, for example, high-concentration impurity regions. The source and drain regions 99 may be disposed lower than the upper isolation region 75 as shown in the figures. The source and drain regions 99 may be disposed higher than the lower isolation region 74.

A conventional transistor may have an effective channel width equal to the first width W1. In contrast, according to some embodiments of the present invention, the gate electrode 93, the source and drain regions 99, the gate dielectric layer 91, and the upper and lower active regions 53 and 67 may form a spherical recess channel array transistor (SR-CAT) with an effective channel width substantially equal to the second width W2. The gate electrode 93 has the lower gate electrode 93S. The lower gate electrode 93S may have substantially the same width as the second width W2. The lower active region 67 may have the second width W2 greater than the upper active region 53. Accordingly, the SRCAT may have an effective channel width substantially equal to the second width W2. That is, an SRCAT according to some embodiments of the present invention may secure a relatively large effective channel width. In the illustrated embodiments, the lower active region 67 acts as a laterally extended active region.

The characteristics of such an SRCAT may be controlled by adjusting depths of the source and drain regions 99. When the source and drain regions 99 are relatively shallow, the SRCAT may have a relatively long effective channel length CL2. When the source and drain regions 99 are relatively deep, the SRCAT may have a relatively large effective channel width.

Methods of fabricating the transistor of FIGS. 2, 9 and 10 according to some embodiments of the present invention will now be described with reference to FIGS. 2 to 10. Referring to FIGS. 2 and 3, a pad oxide layer and a pad nitride layer are sequentially formed on the substrate 51. The substrate 51 may be a semiconductor substrate, such as a silicon wafer. The pad oxide layer may include a thermal oxide layer. The pad nitride layer may include a silicon nitride layer or a silicon oxynitride layer. The pad oxide layer may serve to relieve stress caused by a difference in thermal expansion coefficient between the substrate 51 and the pad nitride layer. The pad nitride layer and the pad oxide layer are patterned to expose portions of the substrate 51 and form a pad oxide pattern 55 and a pad nitride pattern 56. The pad oxide pattern 55 and the pad nitride pattern 56 form a hard mask pattern 57.

The exposed substrate 51 is anisotropically etched using the hard mask pattern 57 as an etch mask to form an upper isolation trench 59. An upper active region 53 is defined within the substrate 51 by the upper isolation trench 59. The upper active region 53 may have a first width W1.

The size of the hard mask pattern 57 may be determined by a resolution limit of a photolithography process. The upper active region 53 may be formed according to the size and shape of the hard mask pattern 57. The first width W1 may be approximately the same as the resolution limit of the photolithography process.

Figure 4:
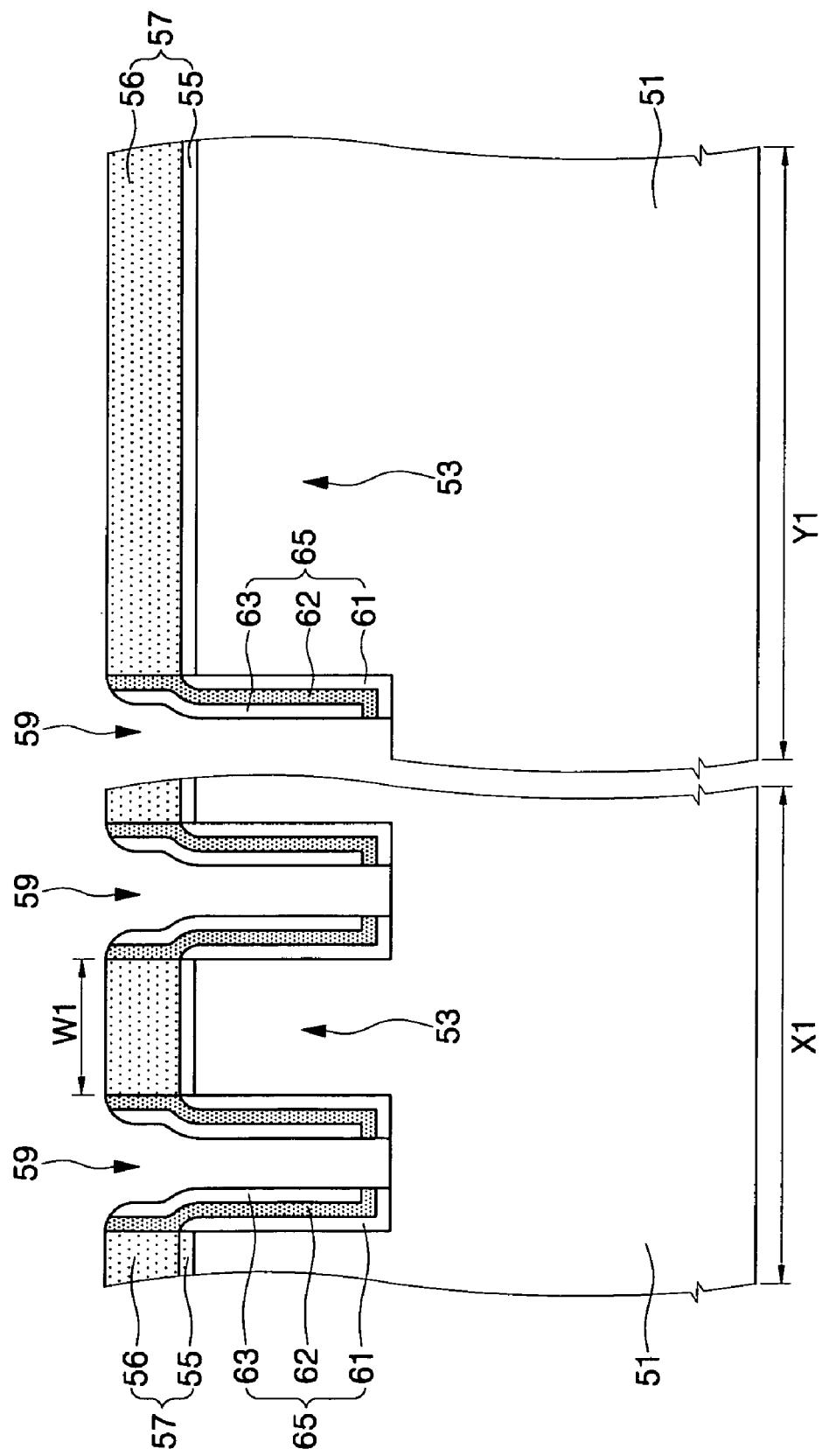

Referring to FIGS. 2 and 4, a spacer 65 is formed on a sidewall of the upper isolation trench 59. The spacer 65 may include, for example, a silicon oxide layer, a silicon nitride layer, a silicon oxynitride layer, or a combination thereof. For example, the spacer 65 may include an upper sidewall oxide layer 61, a nitride liner 62, and a spacer oxide layer 63. Specifically, the upper sidewall oxide layer 61 may be formed on an inner wall of the upper isolation trench 59. The nitride liner 62 may conform to portion of the substrate 51 having the upper sidewall oxide layer 61 thereon. The spacer oxide layer 63 may conform to the portion of the substrate 51 having the nitride liner 62 thereon. The upper sidewall oxide layer 61 may be, for example, a thermal oxide layer. The nitride liner 62 may be, for example, a silicon nitride layer or a silicon oxynitride layer. The spacer oxide layer 63 may be, for example, a silicon oxide layer formed by a chemical vapor deposition (CVD) method. The spacer oxide layer 63, the nitride liner 62, and the upper sidewall oxide layer 61 may be anisotropically etched to expose a bottom surface of the upper isolation trench 59 and leave the spacer oxide layer 63, the nitride liner 62, and the upper sidewall oxide layer 61 on the sidewall of the upper isolation trench 59. An opening for partially exposing the substrate 51 may be formed on the bottom surface of the upper isolation trench 59.

Figure 5:
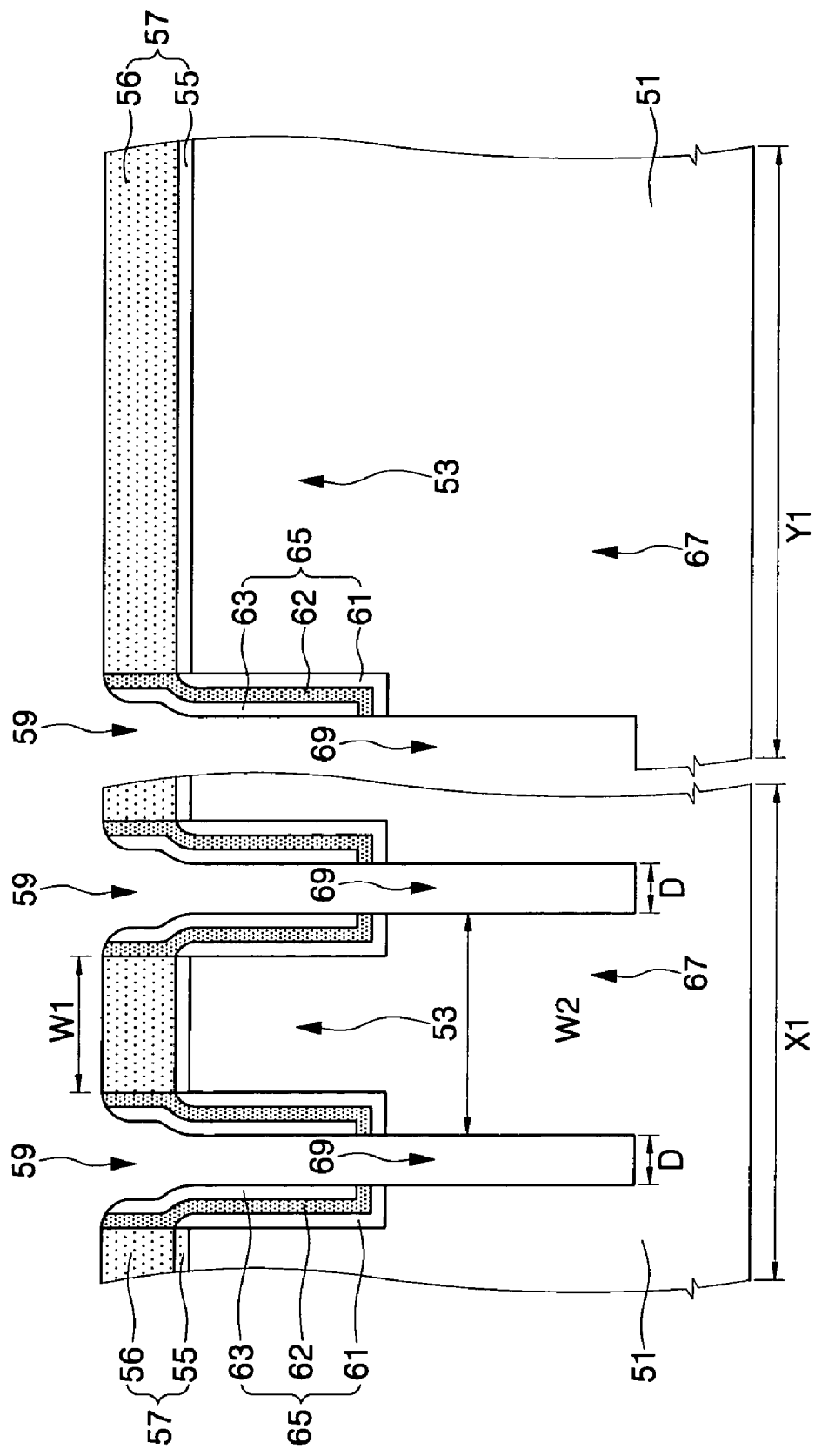

Referring to FIGS. 2 and 5, the portion of the substrate 51 exposed by the opening is anisotropically etched using the spacer 65 and the hard mask pattern 57 as etch masks to form a lower isolation trench 69. This defines the lower active region 67 below the upper active region 53. The lower active region 67 may have a second width W2.

The portion of the substrate 51 exposed by the opening is narrower than the upper isolation trench 59 due to the thickness of the spacer 65. Accordingly, a width D of the lower isolation trench 69 may be less than the width of the upper isolation trench 59. In addition, the width D of the lower isolation trench 69 may be less than a resolution limit of a photolithography process. The size of the lower active region 67 is defined by the width D of the lower isolation trench 69. The second width W2 may be greater than the first width W1. In other words, the lower active region 67 may have a greater width than the upper active region 53.

Figure 6:
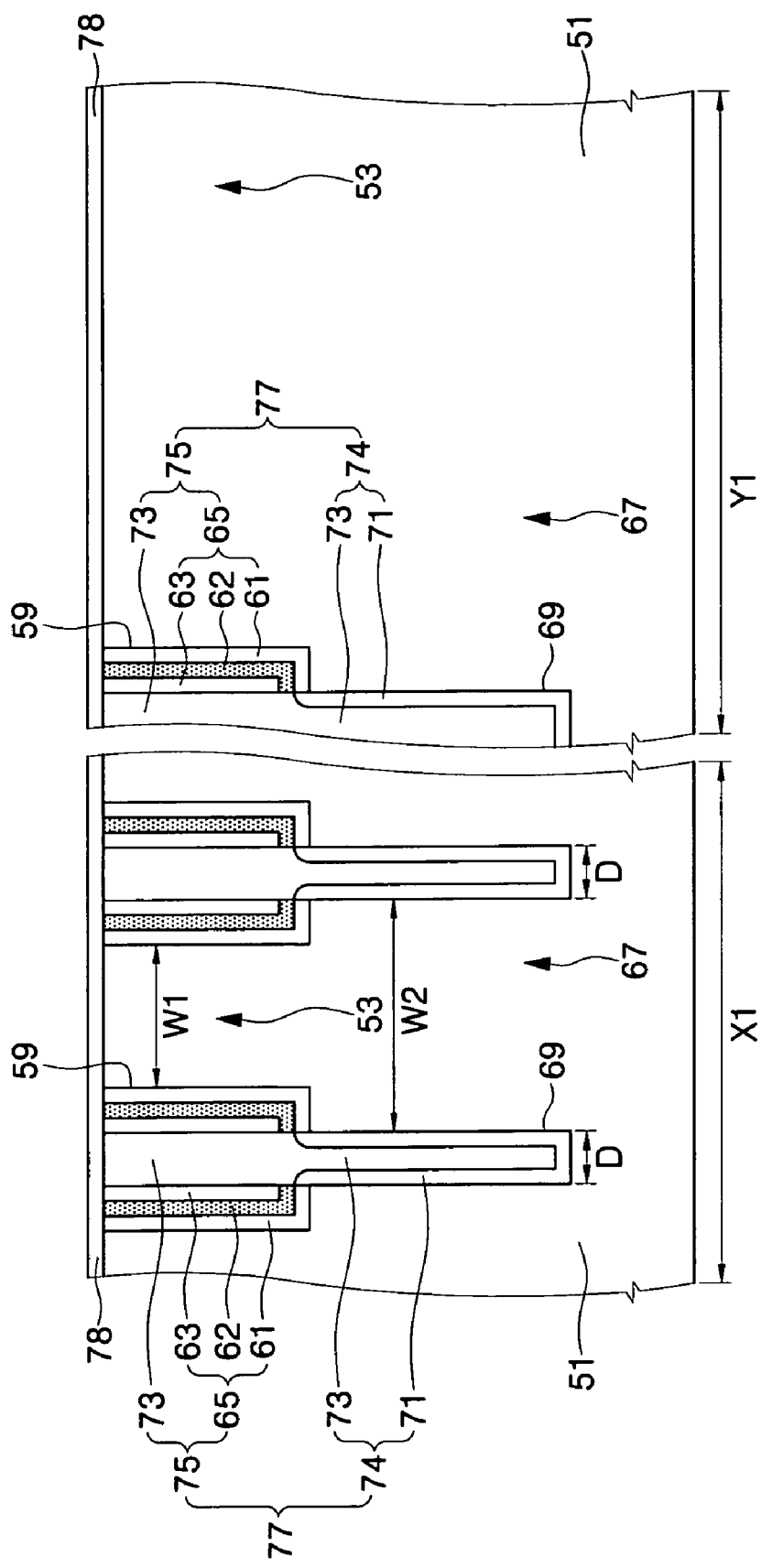

Referring to FIGS. 2 and 6, a lower sidewall oxide layer 71 may be formed on the inner wall of the lower isolation trench 69. The lower sidewall oxide layer 71 may be, for example, a thermal oxide layer. Subsequently, an insulating layer 73 may be formed to fill the lower isolation trench 69 and the upper isolation trench 59 and cover the substrate 51. The insulating layer 73 may be, for example, a HDP oxide layer, a SOG layer, or a combination thereof. The insulating layer 73 may be planarized to expose the hard mask pattern 57. The hard mask pattern 57 may be removed to expose the upper active region 53. The hard mask pattern 57 may be removed, for example, by a wet cleaning process. When the hard mask pattern 57 is removed, the insulating layer 73 and the spacer 65 may also be partially etched.

In this manner, an upper isolation region 75 may be formed within the upper isolation trench 59, and a lower isolation region 74 may be formed within the lower isolation trench 69. The lower isolation region 74 and the upper isolation region 75 may make up an isolation region 77. The lower isolation region 74 includes the insulating layer 73 and the lower sidewall oxide layer 71 covering the insulating layer 73. The upper isolation region 75 includes the insulating layer 73 and the spacer 65 covering the insulating layer 73.

A sacrificial oxide layer 78 may be formed on the exposed upper active region 53. The sacrificial oxide layer 78 may be, for example, a silicon oxide layer. Channel ions may be implanted into the substrate 51 having the sacrificial oxide layer 78. The channel ions may penetrate the sacrificial oxide layer 78 to be implanted into the upper active region 53 and the lower active region 67.

Figure 7:
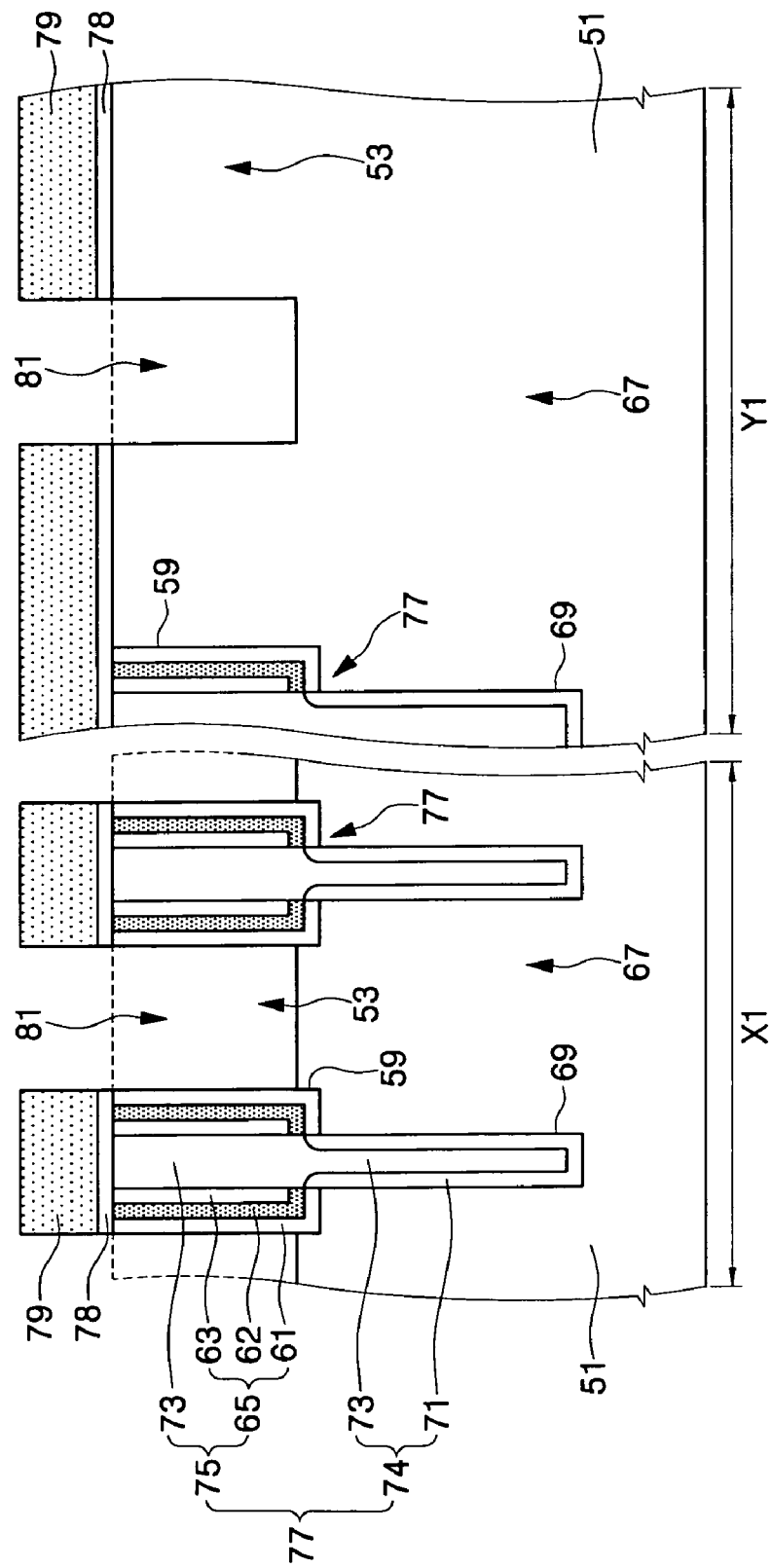

Referring to FIGS. 2 and 7, a gate mask pattern 79 may be formed on the substrate 51 having the sacrificial oxide layer 78 thereon. The gate mask pattern 79 may be, for example, a silicon nitride layer. The gate mask pattern 79 may have an opening crossing the upper active region 53. When the gate mask pattern 79 is formed, the sacrificial oxide layer 78 exposed by the opening may also be removed, i.e., a top surface of the upper active region 53 may be exposed in the opening.

The exposed portion of the upper active region 53 may be anisotropically etched using the gate mask pattern 79 as an etch mask to form an upper gate trench 81. The anisotropic etching may use etching conditions having an etch selectivity between the upper isolation region 75 and the upper active region 53. A bottom surface of the upper gate trench 81 may be higher than the lower isolation region 74, i.e., the upper gate trench 81 crossing the upper active region 53 may be formed within the upper active region 53. The sidewalls of the upper isolation region 75 may be partially exposed by the upper gate trench 81, i.e., the upper gate trench 81 may have substantially the same width as the first width W1.

Referring to FIGS. 2 and 8, a sacrificial spacer 85 may be formed on the sidewall of the upper gate trench 81. Specifically, a conformal sacrificial layer may be formed on the substrate 51 having the upper gate trench 81 therein. The sacrificial layer may be, for example, a silicon oxide layer formed by a CVD process. The sacrificial layer may be anisotropically etched to form the sacrificial spacer 85. The anisotropic etching may be carried out until the substrate 51 is exposed on the bottom surface of the upper gate trench 81.

The exposed substrate 51 may be isotropically etched using the sacrificial spacer 85 and the gate mask pattern 79 as etch masks to form a lower gate trench 82. The isotropic etching may be carried out until the bottom surface of the lower gate trench 82 is lower than the upper active region 53. In addition, the isotropic etching may be terminated when the bottom surface of the lower gate trench 82 is higher than the bottom surface of the lower isolation region 74. The lower active region 67 may be exposed on the bottom surface of the lower gate trench 82.

When the isotropic etching is carried out, the substrate 51 exposed on the bottom surface of the upper gate trench 81 may be substantially uniformly etched in all directions. As a result, the lower gate trench 82 may be greater than the upper gate trench 81. The lower gate trench 82 may be formed below the upper gate trench 81 and may cross the lower active region 67. Sidewalls of the lower isolation region 74 may be partially exposed by the lower gate trench 82, i.e., the lower gate trench 82 may have substantially the same width as the second width W2. The upper gate trench 81 and the lower gate trench 82 form a gate trench 83. The gate trench 83 may have a flask shape when seen in a cross-sectional view. Subsequently, the sacrificial spacer 85 and the gate mask pattern 79 are removed to expose inner walls of the gate trench 83 and the top surface of the upper active region 53.

Referring to FIGS. 2, 9, and 10, a gate dielectric layer 91 is formed on the inner walls of the gate trench 83 and the top surface of the upper active region 53. The gate dielectric layer 91 may be a silicon oxide layer, a high-k dielectric layer, or a combination thereof. The gate dielectric layer 91 may substantially uniformly cover the inner walls of the gate trench 83 and the top surface of the upper active region 53. For example, the gate dielectric layer 91 may be a silicon oxide layer formed by a thermal oxidation process.

A gate conductive layer is formed to fill the gate trench 83 and cover the substrate 51. The gate conductive layer may be, for example, a polysilicon layer. A metal silicide layer may be formed on the gate conductive layer. The metal silicide layer may be, for example, a tungsten silicide layer, a cobalt silicide layer, or a nickel silicide layer. A capping layer may be formed on the metal silicide layer. The capping layer may be, for example, a silicon nitride layer.

The capping layer, the metal silicide layer, and the gate conductive layer may be patterned to form a capping pattern 97, a metal silicide pattern 94, and a gate electrode 93. The gate electrode 93 and the metal silicide pattern 94 may form a gate pattern 95. The gate electrode 93 may extend across the upper active region 53 and the lower active region 67. In addition, the gate dielectric layer 91 may remain on the upper active region 53 at both sides of the gate electrode 93. Alternatively, the top surface of the upper active region 53 at both sides of the gate electrode 93 may be exposed.

When the gate electrode 93 is formed, an upper gate electrode 93E filling the upper gate trench 91 and a lower gate electrode 93S filling the lower gate trench 82 may be formed. The upper gate electrode 93E extends from the bottom of the gate electrode 93, and the lower gate electrode 93S extends from the bottom of the upper gate electrode 93E. The upper gate electrode 93E may have substantially the same width as the first width W1, and the lower gate electrode 93S may have substantially the same width as the second width W2. The lower gate electrode 93S may be partially in contact with the sidewall of the lower isolation region 74. The upper gate electrode 93E and the lower gate electrode 93S may have a flask shape when seen in a cross-sectional view.

Impurity ions may be implanted into the substrate 51 at respective sides of the gate electrode 93 to form source and drain regions 99. The source and drain regions 99 may be, for example, high-concentration impurity regions. The implantation of the impurity ions may be carried out at various angles and energies. The source and drain regions 99 may be higher than the upper isolation region 75 as shown in the figures. The source and drain regions 99 may be higher than the lower isolation region 74.

According to some embodiments of the present invention, a gate electrode 93, source and drain regions 99, gate dielectric layer 91, and upper and lower active regions 53 and 67 form a SRCAT. The lower active region 67 may have the second width W2 greater than the upper active region 53. The gate electrode 93 has the lower gate electrode 93S. The lower gate electrode 93S may have substantially the same width as the second width W2. Accordingly, the SRCAT may secure an effective channel width substantially equal to the second width W2. That is, a SRCAT according to some embodiments of the present invention may secure a relatively large effective channel width, with the lower active region 67 serving as a laterally extended active region. Consequently, a semiconductor device having a laterally extended active region may be fabricated.

Characteristics of such an SRCAT may be controlled by adjusting the depths of the source and drain regions 99. When the source and drain regions 99 are relatively shallow, the SRCAT may have a relatively long effective channel length CL2. When the source and drain regions 99 are relatively deep, the SRCAT may have a relatively large effective channel width.

According to some embodiments of the present invention as described above, an upper active region having a first width and a lower active region having a second width are formed within a substrate. The first width may be determined by a resolution limit of a photolithography process. The second width may be greater than the first width. An insulated gate electrode may be formed across the upper and lower active regions. The insulated gate electrode penetrates the upper active region to extend into the lower active region. The gate electrode has an upper gate electrode and a lower gate electrode. The lower gate electrode has substantially the same width as the second width. Accordingly, an effective channel width substantially equal to the second width may be secured.

Consequently, a semiconductor device having a relatively large effective channel width and having a relatively small planar footprint may be implemented.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims.

What is claimed is:

1. A transistor comprising:
   a substrate;
   spaced-apart first and second isolation regions disposed in the substrate and defining an active region therebetween comprising upper and lower active regions, the upper active region having a first width between the first and second isolation regions and the lower active region having a second width between the first and second isolation regions greater than the first width;
   an insulated gate electrode extending through the upper active region and into the lower active region between the first and second isolation regions, the insulated gate electrode having a first portion having the first width and a second portion having the second width; and
   source and drain regions in the active region on respective first and second sides of the insulated gate electrode.

2. The transistor of claim 1, wherein the insulated gate electrode has a flask-shaped cross-section.

3. The transistor of claim 1, wherein each of the first and second isolation regions comprises an upper isolation region bounding the upper active region and a lower isolation region bounding the lower active region and having a lesser width than the upper isolation region.

4. The transistor of claim 3, wherein the upper gate electrode contacts the upper isolation region.

5. The transistor of claim 3, wherein the lower gate electrode contacts the upper isolation region.

6. The transistor of claim 1, wherein the source and drain regions extend into the lower active region.

7. A method of fabricating a transistor, the method comprising:
   forming spaced-apart first and second isolation regions in a substrate to define an active region therebetween that comprises an upper active region having first width between the first and second isolation regions and a lower active region having a second width between the first and second isolation regions greater than the first width;
   forming an insulated gate electrode that passes through the upper active region and extends into the lower active region between the first and second isolation regions, the insulated gate electrode having a first portion having the first width and a second portion having the second width; and
   forming source and drain regions in the active region on respective sides of the insulated gate electrode.

8. The method of claim 7, wherein forming spaced-apart first and second isolation regions comprises:
   forming a mask pattern on the substrate;
   etching the substrate using the mask pattern as an etch mask to form a first trench;
   forming a narrower second trench in the substrate at a bottom of the first trench; and
   forming an insulation region in the first and second trenches.

9. The method of claim 8, wherein forming a narrower second trench comprises:
   forming a spacer on a sidewall of substrate in the first trench; and
   etching the substrate using the mask pattern and the spacer as an etch mask to form the second trench.

10. The method of claim 9, wherein the spacer comprises a silicon oxide layer, a silicon nitride layer and/or a silicon oxynitride layer.

11. The method of claim 9, wherein forming a spacer comprises:
    forming a first oxide layer on a sidewall of the substrate of the first trench;
    forming a nitride liner on the first oxide layer;
    forming a second oxide layer on the nitride liner; and
    etching the first oxide layer, the nitride liner, and the second oxide layer to expose a bottom surface of the first trench.

12. The method of claim 11, wherein the first oxide layer is a thermal oxide layer, wherein the nitride liner is a silicon nitride layer and/or a silicon oxynitride layer, and wherein the second oxide layer is a silicon oxide layer formed by chemical vapor deposition.

13. The method of claim 8, wherein the second trench is formed to a width less than a resolution limit of a photolithography process used to form the first trench.

14. The method of claim 8, further comprising forming a thermal oxide layer on a sidewall of the substrate in the second trench before filling the first and second trenches with an insulating material.

15. The method of claim 8, wherein forming an insulated gate electrode comprises:
    forming a gate trench in the active region, the gate trench having the first width above a first depth and the second width below the first depth;
    forming a gate dielectric layer conforming to a wall of the active region in the gate trench; and
    forming a conductive region in the gate trench.

16. The method of claim 15, wherein forming a gate trench comprises:
    forming a gate mask pattern on the substrate; and
    etching the active region using the gate mask pattern as an etch mask to form the gate trench to the first depth.

17. The method of claim 16, wherein forming a gate trench further comprises:
    forming a spacer on a sidewall of active region in the gate trench, the spacer exposing a portion of the active region at a bottom surface of the gate trench; and
    etching the exposed portion of the active region at the bottom of the gate trench to deepen and widen the gate trench below the first depth.

18. The method of claim 17, wherein the spacer comprises a silicon oxide layer formed by chemical vapor deposition.

19. The method of claim 15, wherein the gate trench has a flask-shaped cross-section.

20. The method of claim 15, wherein the lower portion of the isolation region is exposed in the gate trench below the first depth.

21. The method of claim 7, wherein forming source and drain regions comprises implanting impurity ions into the active region on the respective sides of the insulated gate electrode.

22. The method of claim 21, wherein the source and drain regions extend into the lower active region.

* * * * *